United States Patent
Oh et al.

(10) Patent No.: US 8,070,048 B2
(45) Date of Patent: Dec. 6, 2011

(54) METHOD OF ATTACHING A SOLDER BALL AND METHOD OF REPAIRING A MEMORY MODULE

(75) Inventors: Nam-Yong Oh, Cheonan-si (KR);
Seong-Chan Han, Cheonan-si (KR);
Jae-Young Kim, Suwon-si (KR);
Jae-Hoon Choi, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/881,439

(22) Filed: Sep. 14, 2010

(65) Prior Publication Data
US 2011/0068151 A1 Mar. 24, 2011

(30) Foreign Application Priority Data
Sep. 23, 2009 (KR) ................. 2009-90006

(51) Int. Cl.
*B23K 1/00* (2006.01)
(52) U.S. Cl. .............. 228/180.22; 228/178; 228/6.2
(58) Field of Classification Search ....... 228/178–10.22, 228/245, 249–255, 4.1, 6.1, 6.2, 33; 257/737–738; 438/612–615
See application file for complete search history.

(56) References Cited

U.S. PATENT DOCUMENTS
2007/0235500 A1* 10/2007 Suh et al. ................ 228/101

FOREIGN PATENT DOCUMENTS
| JP | 08-293668 | 11/1996 |
| JP | 2006-295019 | 10/2006 |
| JP | 2007-095976 | 4/2007 |

* cited by examiner

*Primary Examiner* — David Sample
*Assistant Examiner* — Megha Mehta
(74) *Attorney, Agent, or Firm* — Stanzione & Kim, LLP

(57) ABSTRACT

In a method of attaching a solder ball, a first material is coated on a solder ball. A second material is coated on a pad of a substrate where the solder ball is to be attached to exothermically react with the first material. The solder ball makes contact with the pad such that the first material and the second material exothermically react with each other to release heat to adhere the solder ball to the pad using the heat.

21 Claims, 9 Drawing Sheets

METHOD OF ATTACHING A SOLDER BALL AND METHOD OF REPAIRING A MEMORY MODULE

CROSS-REFERENCE TO RELATED APPLICATIONS

This application claims the benefit of priority under 35 U.S.C. §119 to Korean Patent Application No. 2009-90006, filed on Sep. 23, 2009 in the Korean Intellectual Property Office (KIPO), the entire contents of which are herein incorporated by reference.

BACKGROUND

1. Field of the Invention

Example embodiments relate to a method of attaching a solder ball and a method of repairing a memory module. More particularly, example embodiments relate to a method of attaching a solder ball to a substrate and a method of repairing a defective package of a plurality of packages mounted on a module substrate.

2. Description of the Related Art

Generally, a reflow process may be performed such that a solder ball is attached to a package substrate or a semiconductor package including the solder ball is adhered to a module substrate to form complete a memory module. In the reflow process, a solder paste coated on the solder ball may be heated.

When the solder paste is heated, the package substrate, the module substrate and a semiconductor chip of a semiconductor package may be damaged due to the heat generated during the reflow process. Accordingly, the heat generated during the conventional reflow process may cause warping of the semiconductor package, peeling off of the module substrate, non-wetting problems of the solder ball, etc. As a result, the semiconductor package and the memory module may be deteriorated by the thermal damage.

SUMMARY

Example embodiments provide a method of attaching a solder ball to a pad of a substrate without causing thermal damage.

Example embodiments provide a method of repairing a defective package without causing thermal damage.

Additional aspects and utilities of the present general inventive concept will be set forth in part in the description which follows and, in part, will be obvious from the description, or may be learned by practice of the present general inventive concept.

According to example embodiments, in a method of attaching a solder ball, a first material is coated on a solder ball. A second material is coated on a pad of a substrate where the solder ball is to be attached, and the second material exothermically reacts with the first material. The solder ball makes contact with the pad such that the first material and the second material exothermically react with each other to release heat to adhere the solder ball to the pad using the heat.

In an example embodiment, adhering the solder ball to the pad may include melting the solder ball by the heat that is released by the exothermic reaction of the first material and the second material.

In an example embodiment, first material may include magnesium chloride ($MgCl_2$), sugar ($C_{12}H_{22}O_{11}$), calcium oxide (CaO), etc. The second material may include water or water having catalyst.

In an example embodiment, the solder ball may include tin-bismuth (Sn—Bi) alloy, tin-indium (Sn—In) alloy, etc.

In another example embodiment, the method may further include coating a solder paste on at least one of the solder ball and the pad prior to coating the first material and the second material, and adhering the solder ball to the pad may include melting the solder paste by the heat that is released by the exothermic reaction of the first material and the second material.

A melting point of the solder paste may be lower than that of the solder ball. The solder paste may include tin-bismuth (Sn—Bi) alloy, tin-indium (Sn—In) alloy, etc.

According to example embodiments, in a method of repairing a memory module, a defective BGA package may be removed from a module substrate where a plurality of the BGA packages is mounted. A first material is coated on a solder ball of a normal BGA package. A second material is coated on a pad of the module substrate, wherein the second material exothermically reacts with the first material. The solder ball of the normal BGA package makes contact with the pad such that the first material and the second material exothermically react with each other to release heat to adhere the solder ball of the normal BGA package to the pad using the heat.

In an example embodiment, removing the defective package from the module substrate may include coating the first material on attaching portions between the solder ball of the defective BGA package and the pad of the module substrate, coating the second material on the attaching portions such that the second material exothermically reacts with the first material to release heat, and separating the defective BGA package from the module substrate.

In an example embodiment, the first material may include magnesium chloride ($MgCl_2$), sugar ($C_{12}H_{22}O_{11}$), calcium oxide (CaO), etc. The second material may include water or water having catalyst.

In an example embodiment, the solder ball may include tin-bismuth (Sn—Bi) alloy, tin-indium (Sn—In) alloy, etc.

According to example embodiments, a solder ball or a solder paste may be selectively melted by heat that is released by the exothermic reaction of two different materials, and then, the solder ball may be adhered to a pad of a substrate or the defective solder ball may be separated from the substrate. Since only the attaching portion of the solder ball may be selectively heated by the exothermic reaction, warping or peeling off of the substrate where the solder ball is to be adhered and cracking of a semiconductor chip included in the package may be prevented.

According to another exemplary embodiment, a semiconductor unit comprises a substrate formed with a pad including a first material and a second material, a contact area formed on the pad, a package formed with a solder ball to be attached to the pad of the substrate, and a material formed around the contact area of the pad and the solder ball, wherein the material is formed from the first material of the pad and the second material of the pad.

BRIEF DESCRIPTION OF THE DRAWINGS

Example embodiments will be more clearly understood from the following detailed description taken in conjunction with the accompanying drawings.

Figure 1A:
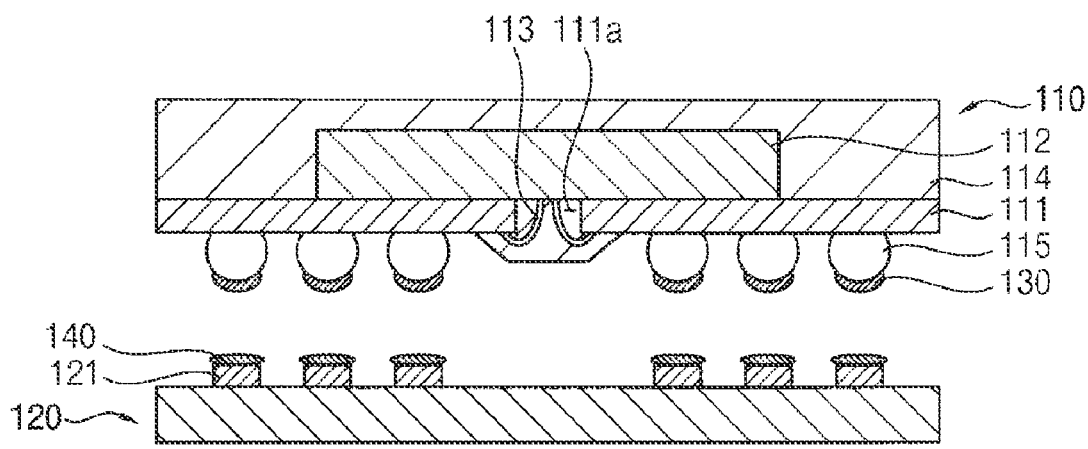
FIGS. 1 to 7C represent non-limiting, example embodiments as described herein.
Figure 1B:
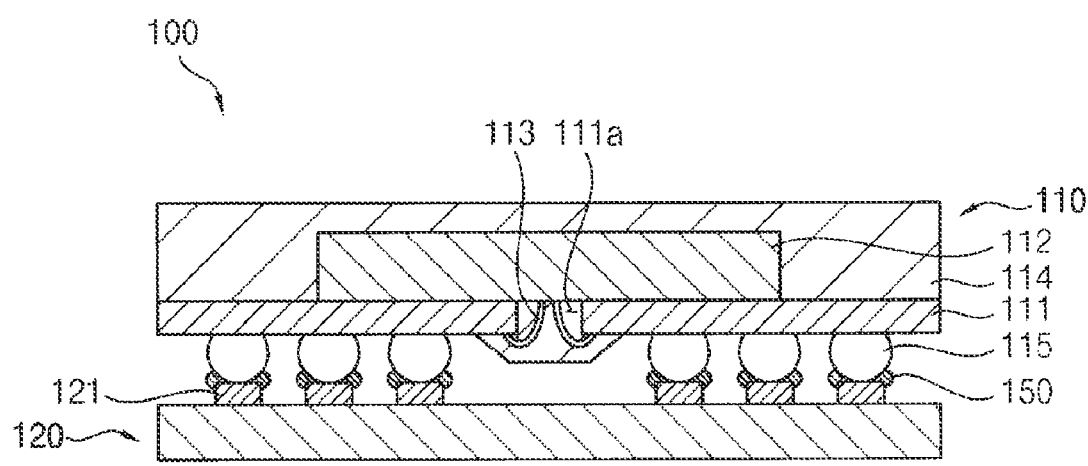

The above and/or other aspects of the present general inventive concept will become apparent and more readily appreciated from the following description of the exemplary embodiments, taken in conjunction with the accompanying drawings, in which:

FIGS. 1A and 1B are cross-sectional views illustrating a method of attaching a solder ball according to an example embodiment.

Figure 2A:
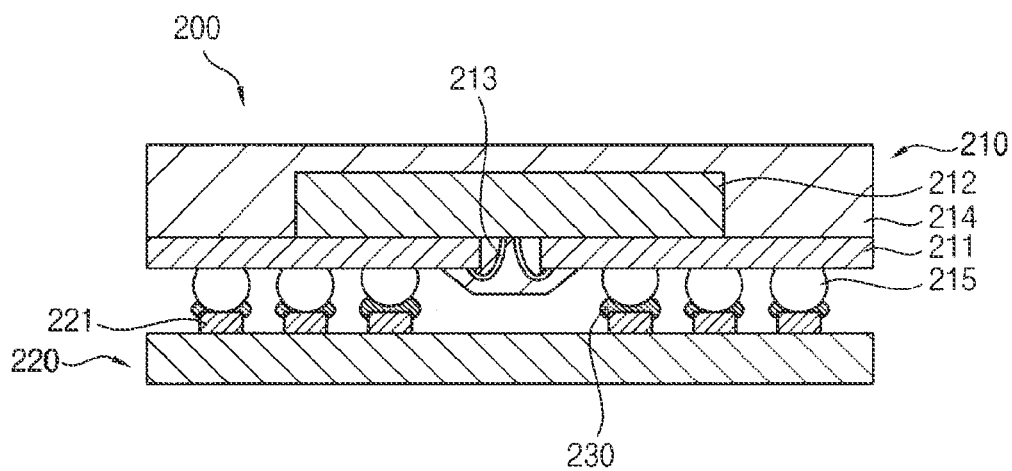
Figure 2B:
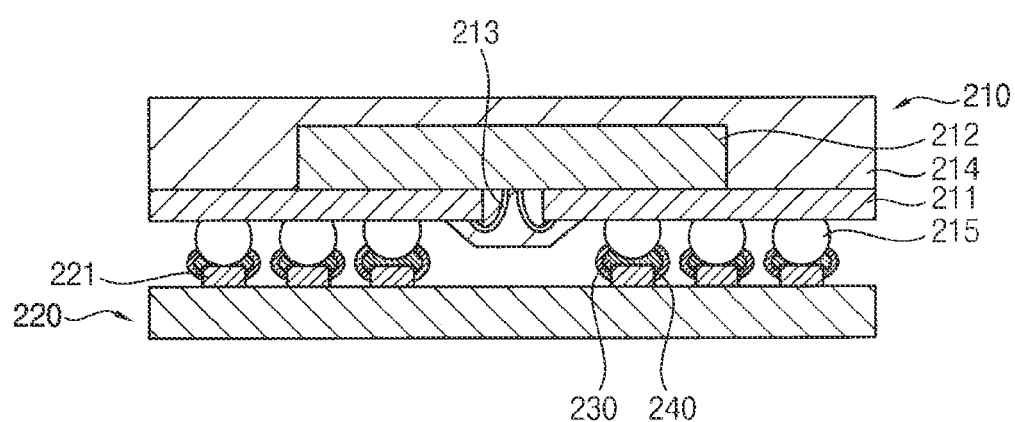
Figure 2C:
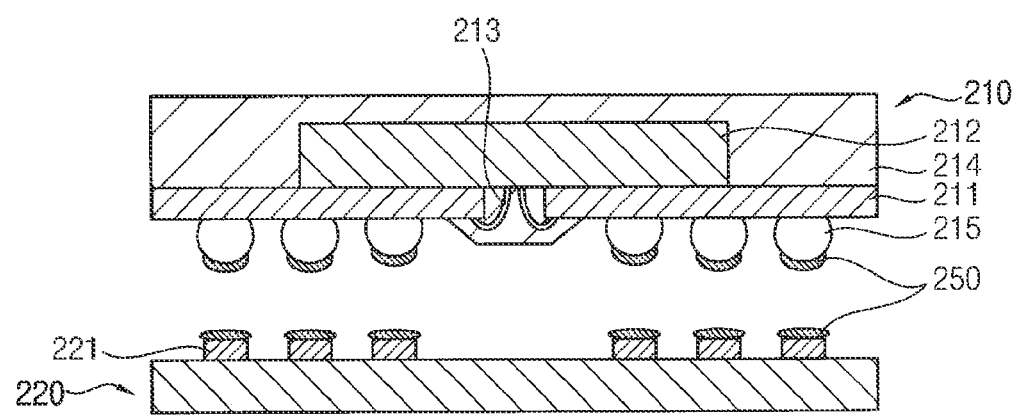

FIGS. 2A to 2C are cross-sectional views illustrating a method of repairing a memory module according to an example embodiment.

Figure 3A:
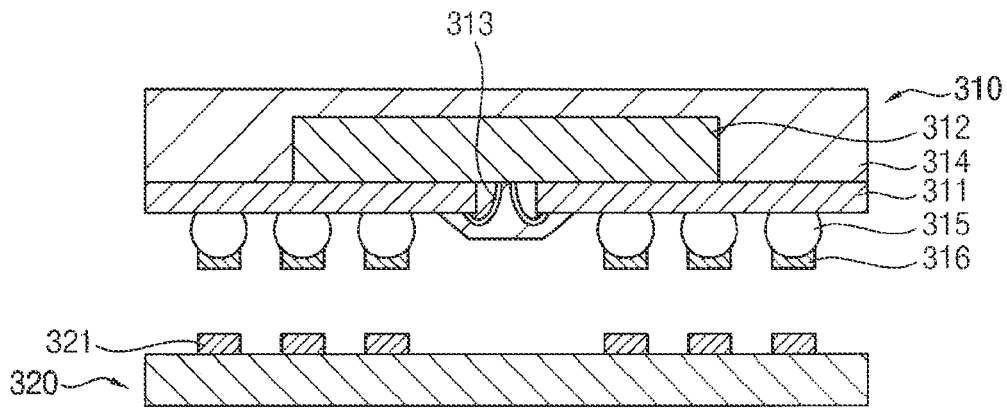
Figure 3B:
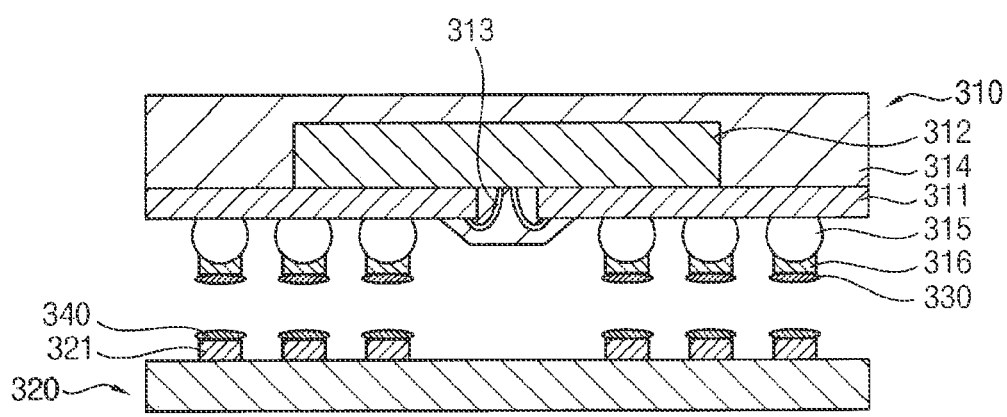
Figure 3C:
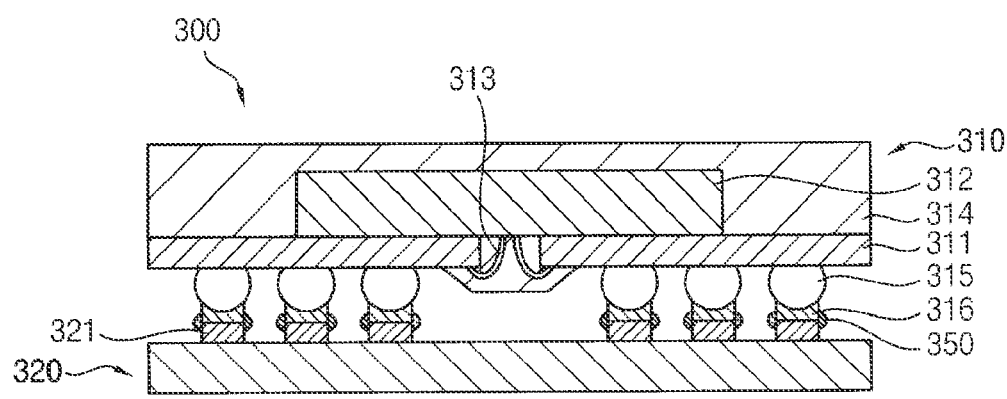

FIGS. 3A to 3C are cross-sectional views illustrating a method of attaching a solder ball according to another example embodiment.

Figure 4A:
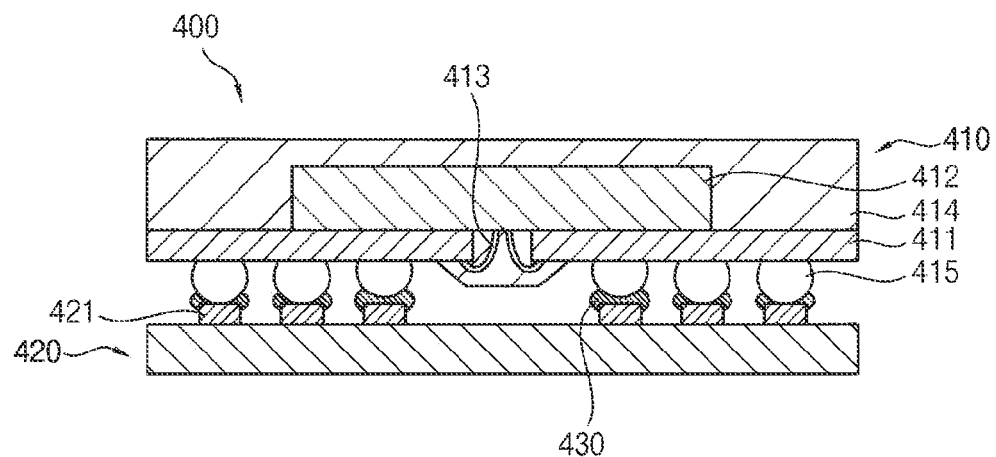
Figure 4B:
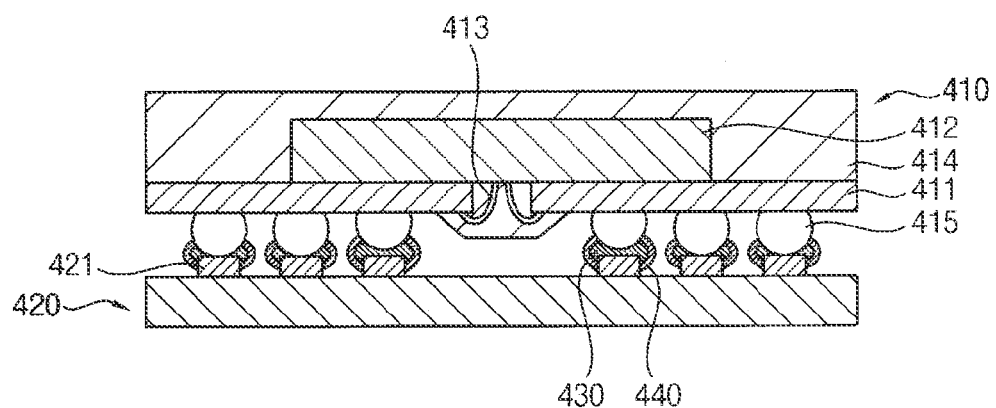
Figure 4C:
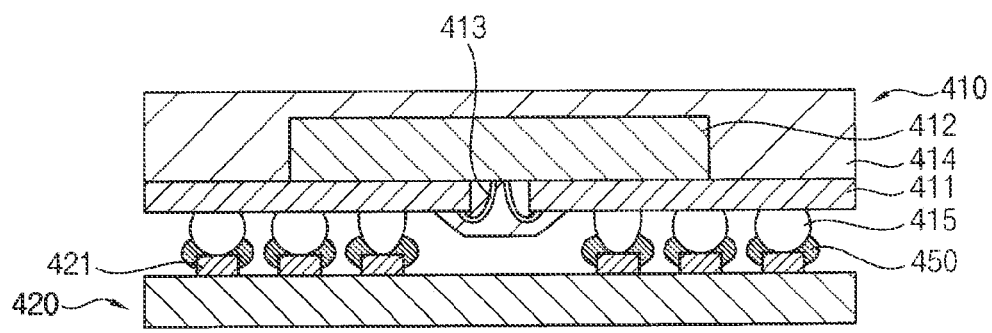

FIGS. 4A to 4C are cross-sectional views illustrating a method of repairing a memory module according to another example embodiment.

FIGS. 5A to 5D illustrate forming first and second materials on connection regions of a solder ball and pad according to an example embodiment.

Figure 6A:
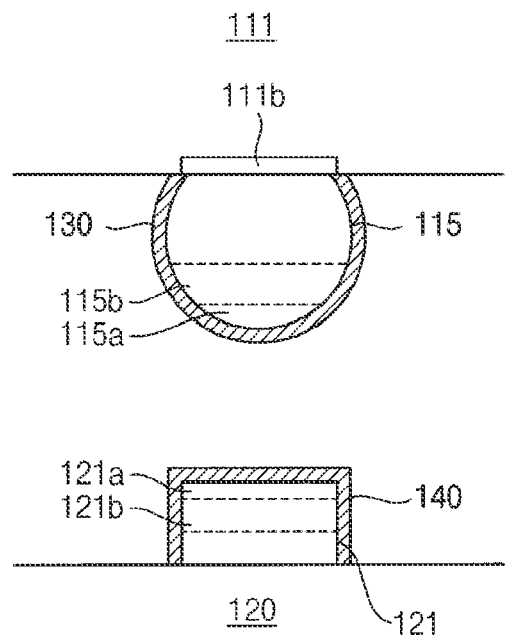
Figure 6B:
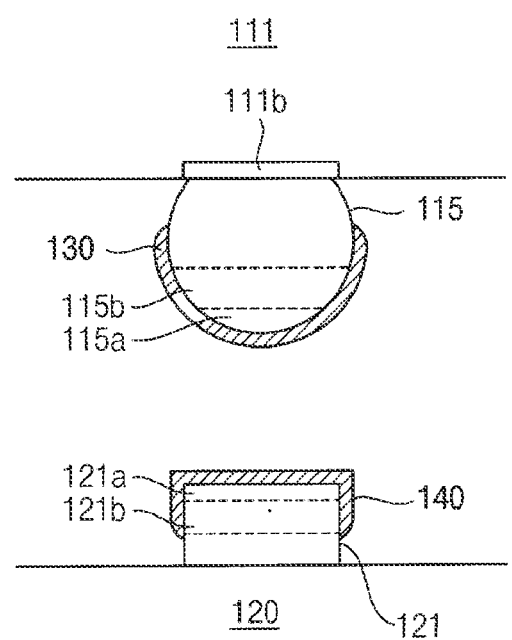

FIGS. 6A and 6B illustrate forming first and second materials on different regions of a solder ball and pad according to an example embodiment.

Figure 7A:
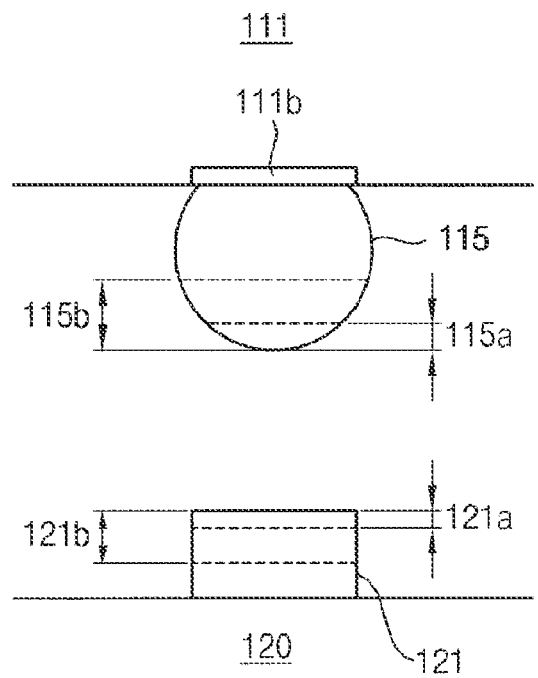
Figure 7B:
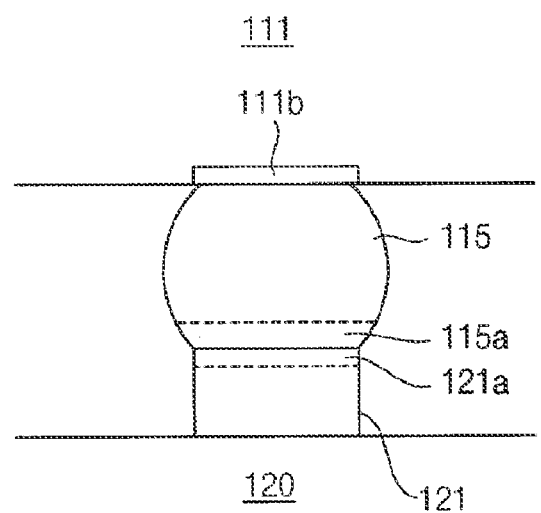
Figure 7C:
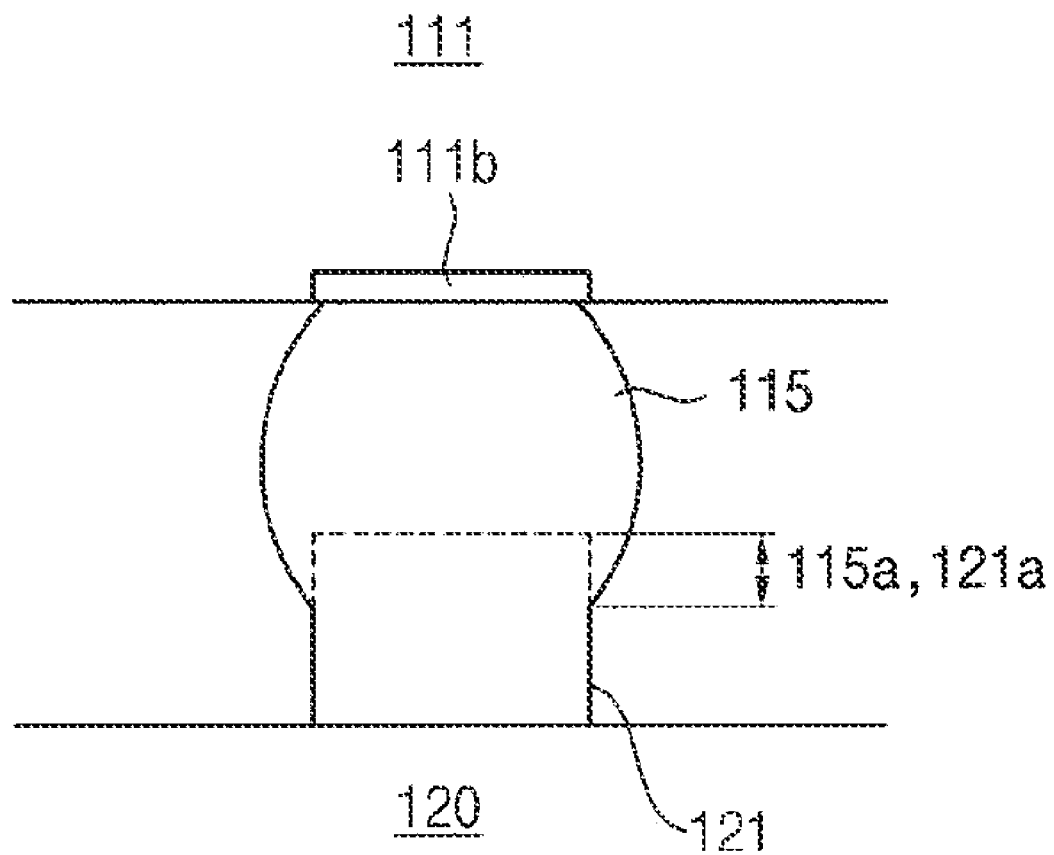

FIGS. 7A to 7C illustrate the connection region and border region of a solder ball and pad according to another example embodiment.

DETAILED DESCRIPTION OF THE EMBODIMENTS

Various example embodiments will be described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to," or "coupled to" another element or layer, it can be directly on, connected to, or coupled to the other element or layer, or intervening elements or layers may be present. In contrast, when an element is referred to as being "directly on," "directly connected to," or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer, or section discussed below could be termed a second element, component, region, layer, or section without departing from the teachings of example embodiments.

Spatially relative terms, such as "beneath," "below," "lower," "above," "upper" and the like, may be used herein for ease of description to describe one element or feature's relationship to another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIGS. 1A and 1B are cross-sectional views illustrating a method of attaching a solder ball in accordance with a first example embodiment.

Referring to FIG. 1A, a ball grid array (hereinafter, referred to as BGA) package 110 and a module substrate 120 are prepared.

The BGA package 110 includes a package substrate 111, a semiconductor chip 112, bonding wires 113, a molding member 114, and solder balls 115.

The semiconductor chip 112 is adhered to an upper surface of the substrate 111. The semiconductor chip 112 has a plurality of pads (not illustrated) on a lower surface thereof.

The bonding wire 113 is drawn through an opening 111a to electrically connect the pad of the semiconductor chip 112 and a wiring of the substrate 111.

The molding member 114 is provided on the substrate 111 to cover the semiconductor chip 112 and the bonding wires 113.

A plurality of the solder balls 115 is provided on the lower surface of the package substrate 111. The solder ball 115 is electrically connected to the wiring of the substrate 111 to serve as an external connection pad. The solder ball 115 may have a low melting point of under 150° C. For example, the solder ball 115 may include tin-bismuth (Sn—Bi) alloy, tin-indium (Sn—In) alloy, etc. The Sn—Bi alloy may include 58% Sn and 42% Bi and have a melting point of about 139° C. The Sn—In alloy may include 50.9% Sn and 49.1% In and have a melting point of about 117° C.

The semiconductor chip 112 may have a pad (not shown) on the lower surface thereof. The bonding wire 113 may be drawn through an opening 111a to electrically connect the pad of the semiconductor chip 112 to the wiring of the substrate 111. Alternatively, the bonding wire 113 may electrically connect the pad of the semiconductor chip 112 to the wiring of the substrate 111 without passing through the opening 111a. Pads or lands on a top surface of the package substrate 111 may connect to pads or lands on the bottom surface of the semiconductor chip 112. Alternatively, or in addition, wires 113 may connect pads or lands of the semiconductor chip 112 to pads or lands on a bottom surface of the package substrate 111.

Additionally, the pad of the semiconductor chip 112 may be electrically connected to the wiring of the substrate 111 by a solder member such as a solder bump, a solder ball, etc.

The module substrate 120 may have a plurality of pads 121 on an upper surface thereof. Each pad 121 may be positioned corresponding to a corresponding solder ball 115 of the BGA package 110. The pad 121 is electrically connected to a wiring (not illustrated) of the module substrate 121.

A first material 130 is coated on the solder ball 115. For example, an attaching or connection portion of the solder ball 115 may be dipped in a solution including the first material 130 such that the solder ball 115 is coated with the first material 130. Alternatively, the first material 130 may be dispensed on, sprayed on, or otherwise applied to the attaching portion of the solder ball 115 such that the solder ball 115 is coated with the first material 130. Only the attaching portion of the solder ball 115 may be coated with the first material 130, or a portion of the solder ball 115 greater than just the attaching portion may be coated with the first material 130. For example, the entire solder ball 115 may be coated with the first material 130.

A second material 140 is coated on the pad 121. For example, an attaching portion of the pad 121 may be dipped in a solution including the second material 140 such that the pad is coated with the second material 140. Alternatively, the second material 130 may be dispensed on the attaching portion of the pad 140 such that the solder ball 115 is coated with the first material 130.

The first material 130 and the second material 140 that are coated on portions except the attaching portions of the solder ball 115 and the pad 121 may be removed using a blowing apparatus (not illustrated). Accordingly, since the first material 130 and the second material 140 coated beside the attaching portions may be prevented from reacting to generate heat, short problems between adjacent solder balls may be prevented.

The second material 140 reacts with the first material 130 to create heat. That is, the chemical reaction of the first material 130 and the second material 140 is exothermic. The first material 130 and the second material 140 may include materials which can exothermically react with each other to release heat capable of melting the solder ball 115. That is, the first material 130 and the second material 140 may be selected to react with each other to create heat capable of melting the solder ball 115. For example, the first material 130 and the second material 140 may not include metal material in order to prevent an electrical short between adjacent solder balls 115 or adjacent pads 121. Alternatively, in case that the first material 130 and the second material 140 are coated only on the attaching portions of the solder ball 115 and the pad 121, the first material 130 and the second material 140 may include metal material.

For example, the first material 130 may include magnesium chloride ($MgCl_2$) and the second material 140 may include water, or vice versa. Alternatively, the first material 130 may include sugar ($C_{12}H_{22}O_{11}$) and the second material 140 may include water having catalyst. Examples of the catalyst may be hydrogen ion, sucrase, etc. When the catalyst is hydrogen ion, the water may be an acid solution. In another example, the first material 130 may include calcium oxide ($CaO$) and the second material 140 may include water.

Referring FIG. 1B, the solder ball 115 of the BGA package 110 is attached to the pad 121 of the module substrate 120. When the solder ball 115 makes contact with the pad 121, the first material 130 and the second material 140 react with each other to form a third material 150 such as a product, to release heat.

For example, when the first material 130 includes magnesium chloride ($MgCl_2$) and the second material 140 includes water, magnesium chloride and water react with each other to form hydrated magnesium chloride ($MgCl_2.nH_2O$) and release heat. Alternatively, when the first material 130 includes sugar ($C_{12}H_{22}O_{11}$) and the second material 140 includes water having catalyst, sugar is hydrolyzed to form glucose ($C_6H_{12}O_6$) and fructose ($C_6H_{12}O_6$) and to release heat. In another example, when the first material 130 includes calcium oxide ($CaO$) and the second material 140 includes water, calcium oxide and water react with each other to form calcium hydroxide ($Ca(OH)_2$) and to release heat.

By heat that is released by the exothermic reaction of the first material 130 and the second material 140, the solder ball 115 is melted to be adhered to the pad 121.

On the other hand, since the third material 150 may not affect the electrical connection between the solder ball 115 and the pad 121, the third material 150 may not be removed. Alternatively, the third material 150 may be removed using a cleaning solution. The cleaning solution may include deionized water or a cleaning solvent.

The solder ball 115 of the BGA package 110 is adhered to the pad 121 of the module substrate 120 to complete a memory module 100 including the BGA package 110 and the module substrate 120.

Heat accompanied by the exothermic reaction begins to take place in the contact portion of the first material 130 and the second material 140. That is, heat accompanied by the exothermic reaction takes place only in the attaching portions of the solder ball 115 and the pad 121. Accordingly, the memory module may be protected from thermal damages by means of thermal reflow, to thereby prevent warping of the BGA package 110 and the module substrate 120, peeling off of the module substrate 120, cracking of the semiconductor chip 112, etc.

FIGS. 2A to 2C are cross-sectional views illustrating a method of repairing a memory module in accordance with a first example embodiment.

Referring to FIG. 2A, a memory module 200 includes a plurality of ball grid array (hereinafter, referred to as BGA) packages 210 mounted on a module substrate 220.

The BGA package 210 includes a package substrate 211, a semiconductor chip 212, bonding wires 213, a molding member 214, and solder balls 115. The module substrate 220 may have a plurality of pads 221 on an upper surface thereof. The BGA package 210 and the module substrate 220 are substantially the same as the BGA package 110 and the module substrate 120 as described with reference to FIG. 1A, and thus, any further repetitive explanation concerning the above elements will be omitted.

Among the BGA packages 210, there may exist a defective BGA package 210 with the solder ball 215 not being electrically connected to the pad 221 of the module substrate 220. That is, any of the BGA packages 210 of the memory module may be not electrically connected to the module substrate 220. In this case, a first material 230 is coated on attaching portions between the solder ball 215 of the defective BGA package 210 and the pad 221 of the module substrate 220. For example, the first material 230 may be dispensed on the attaching portions of the solder ball 215 of the defective BGA package 210 and the pad 221 of the module substrate 220.

The first material 230 that is coated on portions except the attaching portions of the solder ball and the pad may be removed using a blowing apparatus (not illustrated). Accordingly, since the first material 230 coated beside the attaching portions may be prevented from reacting a following second material to generate heat, short problems between adjacent solder balls may be prevented.

Referring to FIG. 2B, a second material 240 is coated on the defective attaching portions between the solder ball 215 and the pad 221. For example, the second material 240 may be dispensed on the attaching portions of the solder ball 215 and the pad 221.

The second material 240 exothermically reacts with the first material 230 to create heat. The first material 230 and the second material 240 may include materials which can exothermically react with each other to release heat capable of melting the solder ball 215. That is, the first material 230 and the second material 240 may be selected to react with each other to create heat capable of melting the solder ball 215. For example, the first material 230 and the second material 240 may not include metal material in order to prevent an electrical short between adjacent solder balls 215 or adjacent pads 221. Alternatively, in case that the first material 230 and the second material 240 are coated only on the attaching portions of the solder ball 215 and the pad 221, the first material 230 and the second material 240 may include metal material.

For example, the first material 230 may include magnesium chloride ($MgCl_2$) and the second material 240 may include water, or vice versa. Alternatively, the first material 230 may include sugar ($C_{12}H_{22}O_{11}$) and the second material 240 may include water having catalyst. Examples of the catalyst may be hydrogen ion, sucrase, etc. In another example, the first material 230 may include calcium oxide (CaO) and the second material 240 may include water.

Referring FIG. 2C, as the second material 240 is coated on the first material 230, the first material 230 and the second material 240 react with each other to form a third material 250 such as a product, to release heat.

For example, when the first material 230 includes magnesium chloride ($MgCl_2$) and the second material 240 includes water, magnesium chloride and water react with each other to form hydrated magnesium chloride ($MgCl_2.nH_2O$) and release heat. Alternatively, when the first material 230 includes sugar ($C_{12}H_{22}O_{11}$) and the second material 240 includes water having catalyst, sugar is hydrolyzed to form glucose ($C_6H_{12}O_6$) and fructose ($C_6H_{12}O_6$) and to release heat. In another example, when the first material 230 includes calcium oxide (CaO) and the second material 240 includes water, calcium oxide and water react with each other to form calcium hydroxide ($Ca(OH)_2$) and to release heat.

Heat that is released by the exothermic reaction of the first material 230 and the second material 240 may melt the solder ball 215, and thus, the defective BGA package 210 may be selectively separated from the module substrate 220.

On the other hand, since the third material 250 may not affect the electrical connection between the solder ball 215 and the pad 221, the third material 250 may not be removed. Alternatively, the third material 250 may be removed using a cleaning solution. The cleaning solution may include deionized water or a cleaning solvent.

Then, a normal BGA package 210 is adhered again to the module substrate 220. The solder ball 215 of the normal BGA package 210 may be adhered to the pad 221 of the module substrate 220 by the processes as described with reference to FIGS. 1A and 1B.

According to the method of repairing a memory module, the attaching portions of the defective BGA package may be selectively heated by the exothermic reaction of the first material 230 and the second material 240 and the defective BGA package may be removed. Then, a normal BGA package may be adhered to the module substrate 220. Accordingly, the memory module 200 may be protected from thermal damages.

FIGS. 3A to 3C are cross-sectional views illustrating a method of attaching a solder ball in accordance with a second example embodiment.

Referring to FIG. 3A, a ball grid array (hereinafter, referred to as BGA) package 310 and a module substrate 320 are prepared.

The BGA package 310 includes a package substrate 311, a semiconductor chip 312, bonding wires 313, a molding member 314, and solder balls 315. The module substrate 320 may have a plurality of pads 321 on an upper surface thereof. The BGA package 310 and the module substrate 320 are substantially the same as the BGA package 110 and the module substrate 120 as described with reference to FIG. 1A, and thus, any further repetitive explanation concerning the above elements will be omitted.

In this embodiment, the solder ball 315 may include tin-lead (Sn—Pb), tin-silver-copper (Sn—Ag—Cu), tin-silver (Sn—Ag), tin-copper (Sn—Cu), tin-bismuth (Sn—Bi), tin-zinc-bismuth (Sn—Zn—Bi), tin-silver-bismuth (Sn—Ag—Bi), tin-silver-zinc (Sn—Ag—Zn), indium-tin (In—Sn), indium-silver (In—Ag), tin-lead-silver (Sn—Pb—Ag), indium-lead (In—Pb), tin (Sn), tin-lead-bismuth (Sn—Pb—Bi), tin-lead-bismuth-silver (Sn—Pb—Bi—Ag), etc.

First, a solder paste 316 is coated on the solder ball 315. Alternatively, the solder paste 316 may be coated on the pad 321 or the solder paste 316 may be coated on both the pad 321 and the solder ball 315. That is, the solder paste 316 may be coated on at least one of the solder ball 315 and the pad 321.

A melting point of the solder paste 316 may be substantially identical to or lower than that of the solder ball 315. The solder paste 316 may have a low melting point of about 150° C. For example, the solder paste may include tin-bismuth (Sn—Bi) alloy, tin-indium (Sn—In) alloy, etc. The Sn—Bi alloy may include 58% Sn and 42% Bi and have a melting point of about 139° C. The Sn—In alloy may include 50.9% Sn and 49.1% In and have a melting point of about 117° C.

Referring to FIGS. 3B and 3C, a first material 330 is coated on the solder paste 315 and a second material 340 is coated on the pad 321. When the first material 330 makes contact with the second material 340, the second material 340 reacts with the first material 330 to create heat capable of melting the solder paste, and thus, the solder ball 315 is adhered to the pad 321. At this time, the solder ball 315 may not be melted by the heat. For example, the solder ball 315 may be adhered to the pad 315 to be melted in a later process or operation.

Processes of coating the first material 330, coating the second material 340 and adhering the solder ball 315 to the pad 321 may be substantially the same as the processes of coating the first material 130, coating the second material 140 and adhering the solder ball 115 to the pad 121 as described with reference to FIGS. 1A and 1B, except that the first material is coated on the solder paste 315 and the solder paste 316 is melted by heat that is created by the exothermic reaction of the first material 330 and the second material 340, and thus, any further repetitive explanation concerning the above processes will be omitted.

Heat accompanied by the exothermic reaction begins to take place in the contact portion of the first material 330 and the second material 340. That is, heat accompanied by the exothermic reaction takes place only in the attaching portions of the solder ball 315 and the pad 321. Accordingly, the memory module 300 may be protected from thermal damages by means of thermal reflow, to thereby prevent warping of the BGA package 310 and the module substrate 320, peeling off of the module substrate 320. Accordingly, the memory module 300 may be prevented from being deteriorated due to thermal damage.

According to a method of repairing a memory module using the solder ball adhering method, a defective BGA package may be removed from the module substrate where a plurality of the BGA packages are mounted. The processes of removing the defective BGA package may be substantially the same as the processes that are described with references to FIGS. 3A to 3C, and thus, any further repetitive explanation concerning the above processes will be omitted.

According to the method of repairing a memory module, the attaching portions of the defective BGA package may be selectively heated by the exothermic reaction of the first material and the second material and the defective BGA package may be removed. Then, a normal BGA package may be adhered to the module substrate. Accordingly, the memory module may be protected from thermal damages.

FIGS. 4A to 4C are cross-sectional views illustrating a method of repairing a memory module in accordance with a third example embodiment.

Referring to FIG. 4A, a memory module 400 includes a plurality of ball grid array (hereinafter, referred to as BGA) packages 410 mounted on a module substrate 420.

The BGA package 410 includes a package substrate 411, a semiconductor chip 412, bonding wires 413, a molding member 414 and solder balls 415. The module substrate 420 may have a plurality of pads 421 on an upper surface thereof. The BGA package 410 and the module substrate 420 are substantially the same as the BGA package 110 and the module substrate 120 as described with reference to FIG. 1A, and thus, any further repetitive explanation concerning the above elements will be omitted.

Among the BGA packages 410, there may exist a defective BGA package 410 with the defective solder ball 415 not being electrically connected to the pad 421 of the module substrate 420. That is, any of the BGA packages 410 of the memory module may be not electrically connected to the module substrate 420. In this case, a first material 430 is coated on an attaching portion of the defective solder ball 415. For example, the first material 230 may be dispensed on the attaching portion of the defective solder ball 415.

The first material 430 that is coated on portions other than the attaching portion of the defective solder ball may be removed using a blowing apparatus (not illustrated). Accordingly, since the first material 430 coated on portions other than the attaching portion may be prevented from reacting to a second material to generate heat, short problems between adjacent solder balls may be prevented.

Referring to FIG. 4B, a second material 440 is coated on the defective attaching portions between the solder ball 415 and the pad 421. For example, the second material 440 may be dispensed on the attaching portions of the solder ball 415 and the pad 421.

The second material 440 exothermically reacts with the first material 430 to create heat. The first material 430 and the second material 440 may include materials which can exothermically react with each other to release heat capable of melting the solder ball 415. That is, the first material 430 and the second material 440 may be selected to react with each other to create heat capable of melting the solder ball 415. For example, the first material 430 and the second material 440 may not include metal material in order to prevent an electrical short between adjacent solder balls 415 or adjacent pads 421. Alternatively, in case that the first material 430 and the second material 440 are coated only on the attaching portions of the solder ball 415 and the pad 421, the first material 430 and the second material 440 may include metal material.

For example, the first material 430 may include may include magnesium chloride ($MgCl_2$) and the second material 440 may include water, or vice versa. Alternatively, the first material 430 may include sugar ($C_{12}H_{22}O_{11}$) and the second material 440 may include water having catalyst. Examples of the catalyst may be hydrogen ion, sucrase, etc. In another example, the first material 430 may include calcium oxide (CaO) and the second material 440 may include water.

Referring FIG. 4C, as the second material 440 is coated on the first material 430, the first material 430 and the second material 440 react with each other to form a third material 450 such as a product, to release heat.

For example, when the first material 430 includes magnesium chloride ($MgCl_2$) and the second material 440 includes water, magnesium chloride and water react with each other to form hydrated magnesium chloride ($MgCl_2.nH_2O$) and release heat. Alternatively, when the first material 430 includes sugar ($C_{12}H_{22}O_{11}$) and the second material 440 includes water having catalyst, sugar is hydrolyzed to form glucose ($C_6H_{12}O_6$) and fructose ($C_6H_{12}O_6$) and to release heat. In another example, when the first material 430 includes calcium oxide (CaO) and the second material 440 includes water, calcium oxide and water react with each other to form calcium hydroxide ($Ca(OH)_2$) and to release heat.

Heat that is released by the exothermic reaction of the first material 430 and the second material 440 may melt the defective solder ball 415, and then, the melted solder ball 415 may be adhered to the pad 421 of the module substrate 420. Thus, the BGA package 410 may be electrically connected to the module substrate 420.

On the other hand, since the third material 450 may not affect the electrical connection between the solder ball 415 and the pad 421, the third material 450 may be left on the solder ball 415 and pad 421. Alternatively, the third material 450 may be removed using a cleaning solution. The cleaning solution may include deionized water or a cleaning solvent.

In this embodiment, the defective solder ball 415 may be selectively heated by the exothermic reaction of the first material 430 and the second material 440. Alternatively, a solder paste (not illustrated) between the defective solder ball 415 and the pad 421 may be selectively melted by heat that is released by the exothermic reaction, and thus, the defective solder ball 415 may be adhered to the pad 421. In this case, a melting point of the solder paste may be substantially identical to or lower than that of the solder ball 415. The solder paste may have a low melting point of about 150° C. For example, the solder ball 415 may include tin-lead (Sn—Pb), tin-silver-copper (Sn—Ag—Cu), tin-silver (Sn—Ag), tin-copper (Sn—Cu), tin-bismuth (Sn—Bi), tin-zinc-bismuth (Sn—Zn—Bi), tin-silver-bismuth (Sn—Ag—Bi), tin-silver-zinc (Sn—Ag—Zn), indium-tin (In—Sn), indium-silver (In—Ag), tin-lead-silver (Sn—Pb—Ag), indium-lead (In—Pb), tin (Sn), tin-lead-bismuth (Sn—Pb—Bi), tin-lead-bismuth-silver (Sn—Pb—Bi—Ag), etc. The solder paste may include tin-bismuth (Sn—Bi) alloy, tin-indium (Sn—In) alloy, etc. The Sn—Bi alloy may include 58% Sn and 42% Bi and have a melting point of about 139° C. The Sn—In alloy may include 50.9% Sn and 49.1% In and have a melting point of about 117° C.

According to the method of repairing a memory module, the disconnected solder ball 415 may be selectively heated by the exothermic reaction of the first material 430 and the second material 440. Accordingly, the memory module 200 may be protected from thermal damages.

Further, the memory module 400 may be repaired without separating the defective BGA package from the module substrate 420. Accordingly, damages of the solder ball 415 or peeling-off of the pad 421 occurring when the BGA package 410 is separated may be prevented.

On the other hand, the solder ball attaching method may be used in attaching solder that is provided between a flip chip and a semiconductor chip to electrically connect them or in attaching a solder that is provided between semiconductor packages stacked on one another to electrically connect them. That is, the above-mentioned method may be used in attaching the solder to a pad of the flip chip, in attaching the solder to a pad of the package substrate and in attaching the solder to a pad of the semiconductor package. According to the above-mentioned method, heat accompanied by the exothermic reaction takes place only in the attaching portions of the solder and the pad. Accordingly, warping of the package substrate and the semiconductor package, peeling off of the package substrate, and thermal damages to the flip chip and the semiconductor package may be prevented. Accordingly, the flip chip package including the flip chip, the solder, and the package substrate and the multi stack package including the stacked semiconductor packages may be prevented from being deteriorated due to thermal damages.

Further, the memory module repairing method may be used in repairing a package or semiconductor package that is adhered via a solder ball.

As mentioned above, according to a solder ball attaching method and a memory module repairing method, a solder ball or a solder paste may be selectively melted by heat that is released by the exothermic reaction of the first material and the second material, and then, the solder ball may be adhered to a pad of a substrate or the defective solder ball may be separated from the substrate. Since only the attaching portion of the solder ball may be selectively heated by the exothermic reaction, warping or peeling off of the substrate where the solder ball is to be adhered and cracking of a semiconductor chip included in the package may be prevented. Accordingly, performances of the package and the memory module including the package may be improved.

Figure 5A:
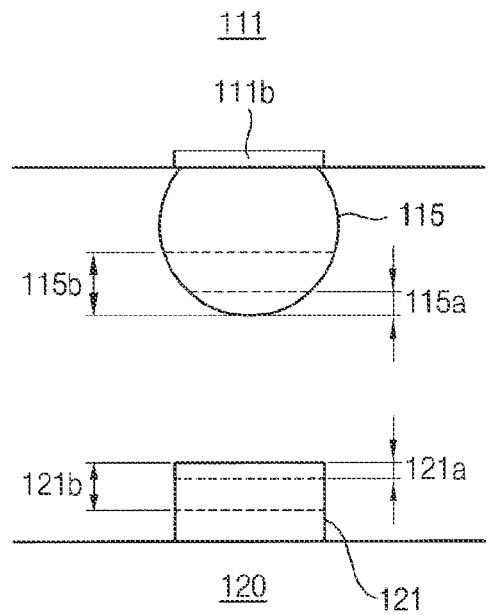

FIGS. 5A to 5D illustrate a solder ball 115 and pad 121 coated with a first and second material 130 and 140, respectively. In FIG. 5A, the solder ball 115 may be connected to a pad or land 111b of the package substrate 111. The solder ball 115 includes a connection region or attaching region 115a and a border region 115b. The connection region corresponds only to the portion of the solder ball 115 that is to be bonded to the pad 121 of the module substrate 120. The border region 115b corresponds to a region that includes the connection region 115a and a further region adjacent to the connection region 115a but less than the entire region between the connection region 115a and the pad 111b. For example, the connection region 115a may include a tip of the solder ball 115 that corresponds to only 10% of an exposed surface area of the solder ball 115, and the border region may include a surface area of the solder ball 115 corresponding to 50% of the exposed surface of the solder ball 115.

Similarly, the pad 121 of the module substrate 120 includes a connection region or attaching region 121a and a border region 121b. Like the attaching region and border region of the solder ball 115, the attaching region or connection region 121a of the pad 121 includes only a portion of the pad 121 corresponding to the area that is electrically and physically connected to the solder ball 115, and the border region 121b includes a further area of the pad 121 less than a total of the exposed area of the pad 121.

Figure 5B:
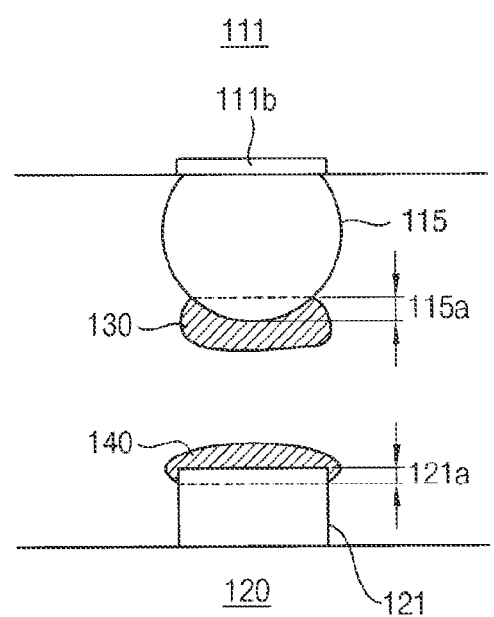
Figure 5C:
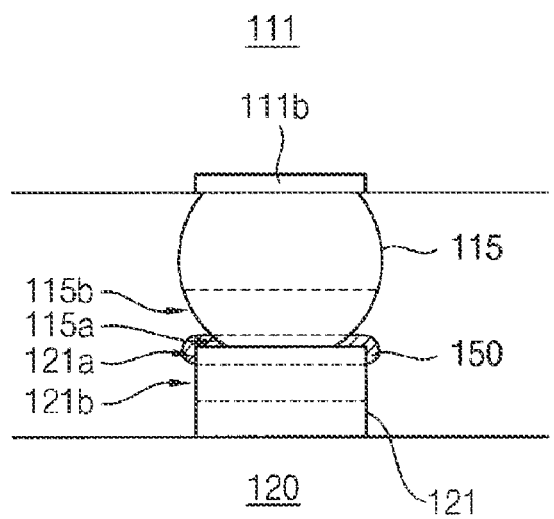
Figure 5D:
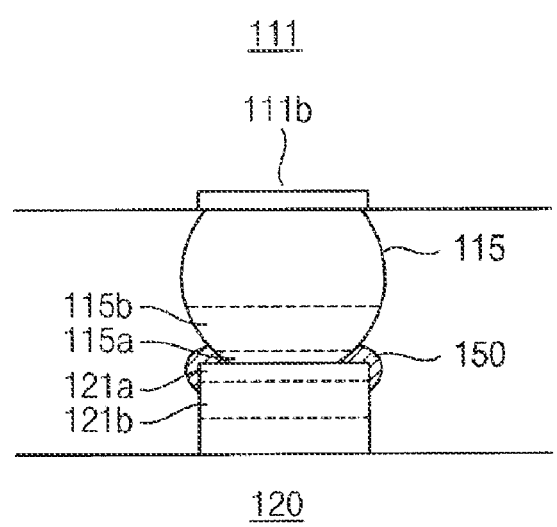

As illustrated in FIG. 5B, the first material 130 may be formed on only the connection region 130 of the solder ball 115, and the second material 140 may be formed only on the connection region 121a of the pad 121. Consequently, when the first material 130 is brought into contact with the second material 140 to melt the solder ball 115, the resulting third material 150 may cover an outer surface of the solder ball 115 and pad 121 corresponding only to the connection regions 115a and 121a of the solder ball 115 and pad 121, respectively, as shown in FIG. 5C. Or, as shown in FIG. 5D, the third material 140 may cover a portion of the border regions 115b and 121b of the solder ball 115 and pad 121, without covering a portion of the solder ball 115 or pad 121 outside the border regions 115b and 121b.

Alternatively, as illustrated in FIGS. 6A and 6B, the first and second materials 130 and 140 may cover an outer surface of the entire solder ball 115 and pad 121 or a substantial portion of the solder ball 115 and pad 121. FIG. 6A illustrates the first and second materials 130 and covering the entire surfaces of the solder ball 115 and pad 121, respectively. On the other hand, FIG. 6B illustrates first and second materials 130 and 140 that cover portions of the solder ball 115 and pad 121 greater than the connection regions 115a and 121a and the border regions 115b and 121b but less than the entire surface of the solder ball 115 and pad 121. For example, the first and second materials 130 and 140 may cover between 60%-80% of the outer surface of the solder ball 115 and pad 121.

FIGS. 7A to 7C further illustrate the connection regions and border regions of the solder ball 115 and pad 121. FIG. 7A is similar to FIG. 5A and illustrates that the solder ball 115 includes a connection region 115a and a border region 115b. The pad 121 also includes a connection region 121a and a border region 121b. FIG. 7B illustrates the solder ball 115 connected to the pad 121. In FIG. 7B, the solder ball 115 is connected only to the upper surface of the pad 121. Thus, the connection region 115a of the solder ball 115 is relatively small, and the connection region 121a of the pad 121 includes only the upper surface of the pad 121.

On the other hand, as illustrated in FIG. 7C, when some of the solder from the solder ball 115 is melted onto side surfaces of the pad 121, then the connection regions 115a and 121a of the solder ball 115 and pad 121 overlap. In addition, the contacting surfaces of the solder ball 115 and pad 121 are larger. The area of the solder ball 115 that contacts the pad 121 may be adjusted by adjusting a pressure applied to the BGA package 110 or the module substrate 120, a duration of time that the solder ball 115 is heated, an amount of a first or second material 130 or 140, a size of the solder ball 115 or pad 121, or any other appropriate characteristic.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of attaching a solder ball, comprising:
   coating a first material on a solder ball;
   coating a second material on a pad of a substrate where the solder ball is to be attached, wherein the second material exothermically reacts with the first material; and
   contacting the solder ball with the pad such that the first material and the second material exothermically react with each other to release heat, to adhere the solder ball to the pad using the heat.

2. The method of claim 1, wherein adhering the solder ball to the pad comprises melting the solder ball by the heat that is released by the exothermic reaction of the first material and the second material.

3. The method of claim 1, wherein the first material comprises any one selected from the group consisting of magnesium chloride ($MgCl_2$), sugar ($C_{12}H_{22}O_{11}$) and calcium oxide (CaO) and the second material comprises any one selected from the group consisting of water and water having catalyst.

4. The method of claim 1, wherein the solder ball comprises any one selected from the group consisting of tin-bismuth (Sn—Bi) alloy and tin-indium (Sn—In) alloy.

5. The method of claim 1, further comprising coating a solder paste on at least one of the solder ball and the pad, prior to coating the first material and the second material,
   wherein adhering the solder ball to the pad comprises melting the solder paste by the heat that is released by the exothermic reaction of the first material and the second material.

6. The method of claim 5, wherein a melting point of the solder paste is lower than that of the solder ball.

7. The method of claim 5, wherein the solder paste comprises any one selected from the group consisting of tin-bismuth (Sn—Bi) alloy and tin-indium (Sn—In) alloy.

8. A method of repairing a memory module, comprising:
   removing a defective BGA package from a module substrate where a plurality of the BGA packages is mounted;
   coating a first material on a solder ball of a normal BGA package;
   coating a second material on a pad of the module substrate, wherein the second material exothermically reacts with the first material; and
   contacting the solder ball of the normal BGA package with the pad such that the first material and the second material exothermically react with each other to release heat, to adhere the solder ball of the normal BGA package to the pad using the heat.

9. The method of claim 8, wherein removing the defective package from the module substrate comprises
   coating the first material on attaching portions between the solder ball of the defective BGA package and the pad of the module substrate;
   coating the second material on the attaching portions such that the second material exothermically reacts with the first material to release heat; and
   separating the defective BGA package from the module substrate.

10. The method of claim 9, wherein the first material comprises any one selected from the group consisting of magnesium chloride ($MgCl_2$), sugar ($C_{12}H_{22}O_{11}$) and calcium oxide (CaO) and the second material comprises any one selected from the group consisting of water and water having catalyst.

11. The method of claim 9, wherein the solder ball comprises any one selected from the group consisting of tin-bismuth (Sn—Bi) alloy and tin-indium (Sn—In) alloy.

12. A method of connecting a solder ball to a conductive pad, the method comprising:
    applying a first material to a surface of the solder ball;
    applying a second material to a surface of the conductive pad, the second material including an ingredient to cause an exothermic reaction upon combining with the first material;
    contacting the first material to the second material to generate an exothermic reaction to melt the solder ball to physically connect the solder ball to the pad.

13. The method of claim 12, wherein the first material is applied only to a portion of the solder ball that contacts the conductive pad.

14. The method of claim 12, wherein the second material is applied only to a portion of the conductive pad that contacts the solder ball.

15. The method of claim 12, wherein the first material is applied to substantially an entire surface of the solder ball.

16. The method of claim 12, wherein the second material is applied to substantially an entire surface of the conductive pad.

17. The method of claim 12, wherein at least one of applying the first material to the solder ball and applying the second material to the conductive pad comprises dipping the solder ball in the first material and the conductive pad in the second material, respectively.

18. The method of claim 12, wherein at least one of applying the first material to the solder ball and applying the second material to the conductive pad comprises spraying a surface of the solder ball with the first material and the conductive pad with the second material, respectively.

19. The method of claim 12, wherein contacting the first material to the second material to generate an exothermic reaction includes forming a third material from the first material and the second material.

20. A method of separating a solder ball from a conductive pad, the method comprising:
    applying a first material to an outer surface of at least one of the solder ball and the conductive pad corresponding to a junction of the solder ball and the conductive pad;
    applying a second material to an outer surface of the first material to melt the solder ball, the second material including an ingredient to cause an exothermic reaction upon combining with the first material to melt the solder ball.

21. The method of claim 20, further comprising, upon melting the solder ball, separating the solder ball from the conductive pad.

* * * * *